United States Patent
Zorian et al.

(10) Patent No.: US 6,330,696 B1
(45) Date of Patent: Dec. 11, 2001

(54) SELF-TESTING OF DRAMS FOR MULTIPLE FAULTS

(75) Inventors: Yervant Zorian, Santa Clara; David Lepejian, Milpitas, both of CA (US)

(73) Assignee: Agere Systems Guardian Corp, Miami Lakes, FL (US)

( * ) Notice: Subject to any disclaimer, the term of this patent is extended or adjusted under 35 U.S.C. 154(b) by 0 days.

(21) Appl. No.: 09/128,595

(22) Filed: Aug. 13, 1998

(51) Int. Cl.[7] ................................................. G11C 29/00
(52) U.S. Cl. ................................................. 714/720; 714/719
(58) Field of Search ................................... 365/201, 222; 714/726, 720, 718, 715, 719; 724/548

(56) References Cited

U.S. PATENT DOCUMENTS

| | | | |
|---|---|---|---|
| 5,091,908 | * | 2/1992 | Zorian ................................... 714/722 |
| 5,107,501 | * | 4/1992 | Zorian ................................... 714/720 |
| 5,157,634 | * | 10/1992 | Dhong et al. ......................... 365/222 |
| 5,375,091 | * | 12/1994 | Berry, Jr. et al. .................... 365/201 |
| 5,377,199 | * | 12/1994 | Fandrich .............................. 714/726 |
| 5,381,419 | * | 1/1995 | Zorian ................................... 714/720 |
| 5,513,318 | * | 4/1996 | Van de Goor ......................... 714/48 |
| 5,677,634 | * | 10/1997 | Cooke et al. ......................... 324/548 |
| 5,748,640 | * | 5/1998 | Jiang et al. ........................... 714/720 |
| 5,907,561 | * | 5/1999 | Blish, II et al. ...................... 714/718 |
| 5,943,280 | * | 8/1999 | Tsukamoto et al. .................. 365/222 |
| 5,963,491 | * | 10/1999 | Arimoto ................................ 365/201 |
| 5,999,467 | * | 12/1999 | Bissey ................................... 365/201 |

OTHER PUBLICATIONS

El–Kareh et al.; "The evolution of DRAM cell Technology", Solid State Technology, May 1997, pp. 89–101.*

* cited by examiner

*Primary Examiner*—David Ton
(74) *Attorney, Agent, or Firm*—Howard R. Popper

(57) ABSTRACT

DRAM memory unit is tested for a series of cell faults such as: the stuck-at fault (SAF), the stuck-open fault (SOF), the transition fault (TF), the multiple address fault (MAF) as well as storage capacitor leakage, subthreshold leakage or junction leakage. Predetermined data pattern is written throughout the DRAM memory, locations in one region of the memory are "frozen" while a disturbance is created in a second region during an interval sufficient for a defective cell in the first region to lose its charge, following which the locations of the first region are sequentially read to verify if any cell has lost its data.

5 Claims, 1 Drawing Sheet

SELF-TESTING OF DRAMS FOR MULTIPLE FAULTS

FIELD OF THE INVENTION

This invention relates to a method of self-testing memory units and, more particularly, to a method of self-testing dynamic random access memories (DRAMs).

BACKGROUND OF THE INVENTION

In U.S. Pat. No. 5,513,318 assigned to the assignee of the present invention, a technique is disclosed for accomplishing the "built-in" self-testing (BIST) of first-in, first-out (FIFO) memory units employing ring counter accessing of static random access memory units (SRAM)s. Sequences of operations are performed on the memory unit under test to detect faults associated with the read-out of spurious data in the presence and absence of real data having been stored in the memory, the ability to accept read and write commands, the resetting of the read and write access registers simultaneously and independently, etc., including alteration of various flag signals normally set or unset to indicate proper memory operation. While the arrangement described in the above-mentioned patent operates satisfactorily, it would be advantageous to achieve a self-testing ability for memory units other than FIFO memories and, in particular, to dynamic random access memories (DRAM)s.

A DRAM differs from an SRAM in the technology of the memory cell employed for the storage of binary information. Basically, the SRAM uses a flip-flop in each memory cell which remains indefinitely in the state to which it has been set. The DRAM memory cell employs a capacitor to store a charge whose value must periodically be refreshed because the charge tends to leak-off with time. Typically, an SRAM requires approximately 6 transistors per memory cell while a DRAM memory will employ only two transistors per memory cell, one of which is employed for accessing and the other of which stores the charge. Often "two-rail" logic is used so that a cell $C_{i,j}$ is provided to store a bit value (data bit b) and a conjugate cell $\underline{C}_{i,j}$ is provided to store the opposite bit value b. Because fewer transistors are required in the DRAM memory these memories tend to be used where high information storage density is required while SRAM memory is used where fast access is required.

Because the technology of the DRAM capacitor memory cell differs from that of the SRAM, its failures occur in ways that are entirely different from the way that an SRAM may fail. Because of these differences, some of the testing techniques applicable to SRAMs will not operate satisfactorily with DRAMs. Accordingly, it would be desirable to be able to provide a self-test routine which took into account the different ways that failure can occur in a DRAM so that appropriate remedial measures could be taken.

SUMMARY OF THE INVENTION

The foregoing and other objects are achieved in an illustrative embodiment of the present invention in which a DRAM memory unit is tested for a series of cell faults similar to those occurring in SRAMS such as: the stuck-at fault (SAF), the stuck-open fault (SOF), the transition fault (TF), the multiple address fault (MAF) (arising from static or dynamic coupling, as well as faults in the address decoder. However, to detect such faults in a DRAM it is necessary first to address each location of the DRAM in a prescribed order, writing a predetermined pattern in the location, reading the location, repeating the procedure using a complementary pattern and then repeating both procedures while re-addressing the memory locations in the opposite order.

The DRAM is also tested for a series of faults unlike those that may occur in SRAMs, including storage capacitor leakage, subthreshold leakage or junction leakage causing a defective cell in one portion of the memory to affect values stored in another portion. To test for these faults, a predetermined pattern is written throughout the DRAM memory, a time sufficient for a defective storage element to lose its charge is allowed to elapse, and then locations in a first portion of the memory are either frozen or sequentially addressed to create a disturbance while the locations in a second portion of the memory are read to verify whether changes in the stored pattern have occurred. To check for subthreshold leakage the locations in the first portion are frozen while, to check for storage capacitor leakage or junction leakage, the locations in the first portion are sequentially and repetitively written with a predetermined pattern, following which the locations in the second portion of the memory are read to verify whether the stored values have been changed by the previous step. To check for storage capacitor leakage and junction leakage, the pattern written into memory is a "checkerboard" of alternating "1" and "0" values as well as the complementary checkerboard pattern. Finally, the test is repeated interchanging the first and second portions of memory.

DESCRIPTION OF THE DRAWING

The foregoing objects and features may become more apparent when the ensuing description is read together with the drawing the single figure of which

GENERAL DESCRIPTION

Figure 1:
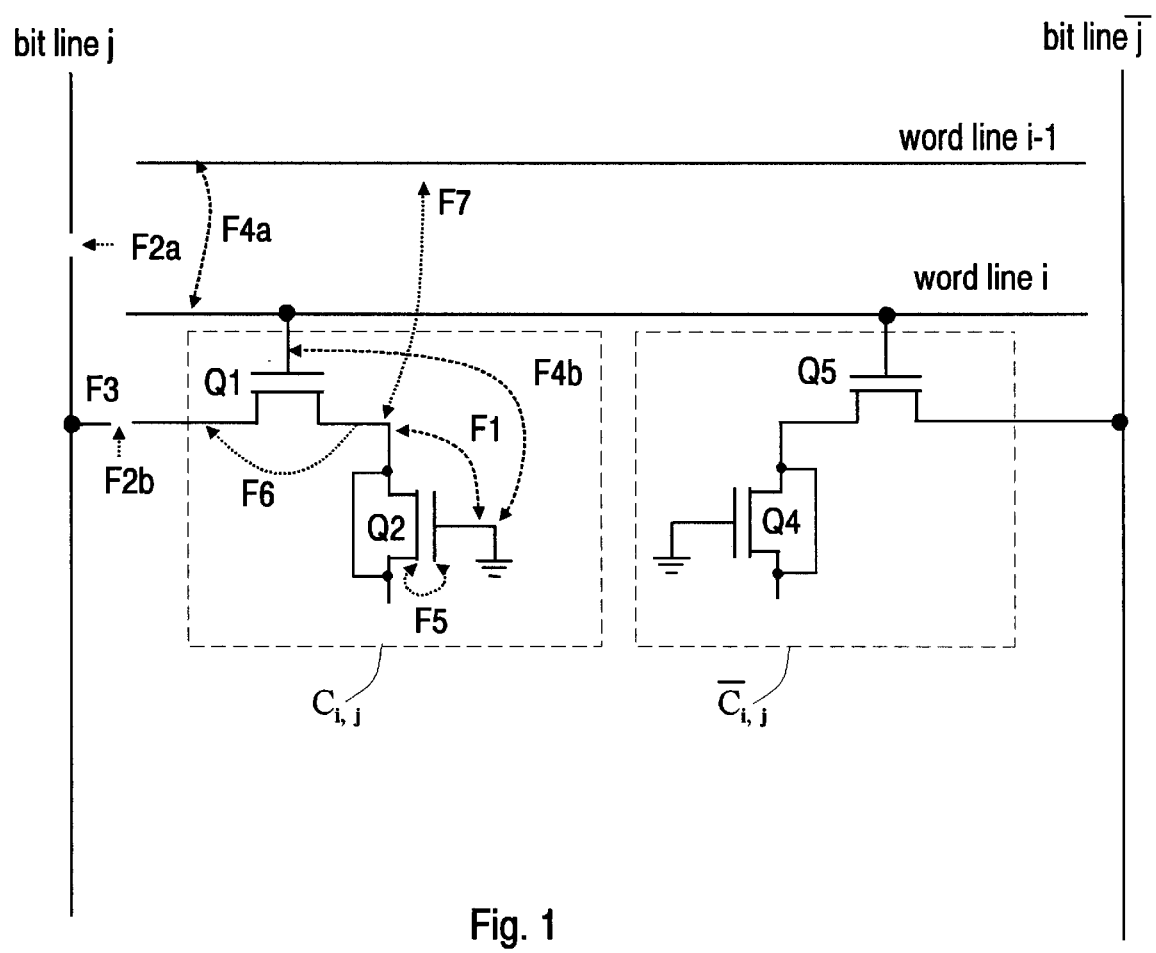
FIG. 1 shows a simplified schematic diagram of a DRAM cell.

Referring to FIG. 1, there is shown a schematic diagram of a small portion of a DRAM array which typically would comprise multiple copies of the cells shown therein. While DRAM arrays are known which use only one memory cell per bit rather than conjugate memory cells, FIG. 1 shows a DRAM memory which employs conjugate cells $C_{i,j}$ and $\underline{C}_{i,j}$. For simplicity, only one conjugate pair of cells are shown, but it should be understood that there will be many such cells, typically many millions. The memory array is addressed for writing by coincidentally addressing a word line, such as word line i, which activates all of the cells comprising a single word, and by individually accessing the bit lines, such as bit line j, for each bit of that word. This coincident addressing identifies a particular cell in the memory array, such as cell $C_{i,j}$ shown. The memory array is addressed for reading by applying a particular voltage to all of the bit lines, by individually coincidentally addressing a single word line, such as word line i, and then observing the signals appearing at the bottom of each of the bit lines of the array.

Transistors Q1 and Q2 form memory cell $C_{i,j}$ while transistors Q4 and Q5 form conjugate memory cell $\underline{C}_{i,j}$. For example, memory cell $C_{i,j}$ is addressed for writing by word line addressing circuitry (not shown) selecting word line i while at the same time data circuitry (not shown) applies a "0" or a "1" on bit line j. Usually a voltage $V_{dd}$ will be applied corresponding to a "1" bit on a bit line as well as to indicate the selection of a particular word line. Memory cell $\underline{C}_{i,j}$ is addressed for writing by conjugate data addressing circuitry (not shown) placing a "1" or a "0" on bit line j.

When word line i is selected, the gate of transistor Q1 is activated, enabling transistor Q1 to convey the bit value on bit line j to transistor Q2 which has its source and drain electrodes connected together to enable it to store the polarity of charge corresponding to the bit value on bit line j. At the same time, transistor Q5 is enabled to convey the bit value on bit line j̄ to transistor Q4 which has its source and drain electrodes connected together to enable it to act as a capacitor to store the polarity of charge corresponding to the bit value on bit line j̄.

At some time after a bit value has been stored in the memory cells, as described above, it will be desired to read out what has been stored, not only in the pair of memory cells shown, but in all of the other memory cells (not shown) which are similarly accessible to word line i. Readout is accomplished by the read circuitry applying a voltage of $V_{dd}/2$ to all of the bit lines and by word line addressing circuitry (not shown) accessing word line i. At the same time, readout registers (not shown) at the bottom of each of the bit lines, ascertain the bit values appearing on all of the bit lines.

The Test Procedure

The DRAM memory unit of FIG. 1 is subjected to tests for the faults listed in Table 1, as identified by the reference numbers in FIG. 1 and taken as indicated by the steps of Table 2. The tests assume the standard fault model for memory described in "Testing Semiconductor Memories Theory and Practice", A. J. van de Goor, John Wiley & Sons Ltd., West Sussex, England, 1996. See also, van de Goor U.S. Pat. No. 5,513,318 assigned to the assignee of the present invention.

TABLE 1

DRAM Cell Array Faults

| Type of Fault | Identification (See FIG. 1) | Steps (See Table 2) |
|---|---|---|
| SAF | F1 | 1–5 |
| TF | F1 | |
| SOF | F2 | |
| MAF | F4 | |
| RF | F5 | 11–18 |
| RF | F6 | 6–10 |
| RF | F7 | 11–18 |
| SCF | F3 | 1–5 |

Referring both to Table 1 and FIG. 1, the dotted arrow F1 between the gate of transistor Q2 and the connection between transistors Q1 and Q2 indicates an example of a stuck at "0" or "1" (SAF) fault. A stuck at "0" or "1" fault occurs when a short-circuit occurs between the gate and source electrodes of transistor Q2. Under this condition, a ground will always appear on bit line j when word line i is addressed. Depending on the polarity of logic employed in the array, the ground corresponds to either a "1 " or a "0" bit always appearing on bit line j when word line i is addressed. Thus, the cell appears to be stuck at the same value, regardless of the value of the bit that had been attempted to be stored in cell $C_{i,j}$. The aforementioned short circuit also causes a similar type of fault termed a "transition" fault to occur since it will be impossible to "toggle" or change the value of the bit attempted to be stored in the cell.

The next type of fault is termed a "stuck open" (SOF) fault and an example thereof is identified at F2a and at F2b in FIG. 1. This type of fault occurs because of an open-circuit, e.g., the absence of metal, in a bit line such as bit line j, and is indicated at F2a. Alternatively, the absence of metal may occur between cell $C_{i,j}$ and bit line j, as indicated at F2b. When this type of fault occurs, it will be impossible to read the value that was attempted to be stored in the cell and the bit lines j and j̄ will become equalized to a voltage $V_{dd}/2$. For example, when cell $C_{i,j}$ is operating correctly, the application of readout voltage Vdd/2 to the top of bit line j should be observed by the appearance of the voltage Vdd or 0 at the bottom of bit line j because the voltage Vdd/2 will be modified by the charge on transistor capacitor Q2. Similarly, the charge on transistor capacitor Q4 will modify the voltage that can be sensed by readout amplifiers (not shown) at the bottom of bit line j̄ However, if fault F2a occurs in bit line j, the voltage Vdd/2 applied at the top of bit line j cannot modify the charge on transistor Q1 and so the voltage appearing at the bottom of bit line j̄ will not change. However, the application of voltage Vdd/2 to the top of bit line j̄ will be modified by the charge on transistor Q24 and the modified voltage will appear at the bottom of bit line j̄. Thus the voltages at the bottom of bit line j will not change but the voltage at the bottom of bit line j̄ will change. This disagreement is indicative of the fault.

On the other hand if the fault at F2b occurs (but not the fault at F2a), the charge on transistor capacitor Q2 will be unable to modify the voltage appearing at the bottom of bit line j, but only when word line i is selected. When other word lines are selected it will be found that the voltage appearing at the bottom of bit line j is affected by the charge existing at its cell at the intersection with bit line i. The sense amplifiers at the bottom of the bit lines j, j̄ expect to see the value Vdd or 0 on the bit lines and, when a voltage like Vdd/2 appears on one of the bit lines, the sense amplifier associated with that bit line will not be able to read it and therefore the output latch driven by that sense amplifier will merely report the value that had been previously stored in the output latch.

The next type of fault is known as the "multi-access" (MAF) fault and can occur in two different ways, as indicated in FIG. 1 at F4a and at F4b. Fault F4a indicates a short-circuit between two word lines such as between word line i and word line i-1. When this fault occurs, two word lines will be accessed and written into during a write operation and the cells of both words will be accessed during a read operation, giving anomalous results. Should the fault F4b occur, word line i will be stuck at ground.

Faults F1, F2 and F4 are somewhat similar to faults that can occur in SRAMs, although the causes are different because of the different physical structures involved. However, faults F5, F6 and F7 are peculiar to DRAMS and are classified as "retention" or leakage faults resulting in the inability of one or more of the transistor capacitors to accept or to retain a charge for the required time. Fault F5 is a storage capacitor leakage fault (SCL) and is caused by a poor dielectric between the "plates" of the capacitor Q2 resulting in the charge leaking off before the arrival of the refresh command can restore the charge. Fault F6 is a sub-threshold leakage fault (STL) which results in the charge on capacitor Q2 leaking-off through the source-to-drain path of transistor Q1. Fault F7 is a junction leakage fault (JL) caused by a defective pn junction forming a low resistance bridge, resulting in leakage of the charge from the drain of Q2 through its substrate. Leakage via the substrate may impact a neighboring cell. Detection of junction leakage faults is accomplished by storing a pattern of alternating values in neighboring cells, such as storing a "checkerboard" pattern of"1"s and "0"s in the DRAM. In accordance with the invention, a method has been provided for testing the DRAM of FIG. 1 to detect potential memory faults, address faults and functional faults by causing the DRAM to execute several sequences of functional operations, read operations and write operations.

The steps of the method are illustrated in tabular form in Table 2.

TEST 2

| Test | Operation | Faults Detected |
|---|---|---|
| 1 | ⇑W$^p$ | F1–F4; SAF, TF, SOF, MAF |
| 2 | ⇑R$^p$W$^{pc}$ | |
| 3 | ⇑R$^{pc}$W$^p$R$^p$W$^{pc}$ | |
| 4 | ⇓R$^{pc}$W$^p$ | |
| 5 | ⇓R$^p$W$^{pc}$R$^{pc}$W$^p$ | |
| 6 | (⇑W$^1$) | (RF: |
| 7 | RET // LH$_{add}$R | F6: Subthreshold Leakage) |
| 8 | ⇑HH$_{add}$R$^1$ | |
| 9 | RET // HH$_{add}$R | |
| 10 | ⇑LH$_{add}$R | |
| 11 | ⇑W$^{ckb}$ | (RF: |
| 12 | RET$_{LH}$ // ⇑CONT$_{HH}$W$^{ckb}$ | F5: Storage Cap. Leakage and |
| 13 | ⇑LH$_{add}$R$^{ckb}$ | F7: Junction Leakage) |
| 14 | RET$_{HH}$// ⇑CONT$_{LH}$W$^{ckbc}$ | |
| 15 | ⇑$_{LH}$R$^{ckb}$R$^{ckb}$ | |
| 16 | RET$_{LH}$// ⇑CONT$_{HH}$W$^{ckbc}$ | |
| 17 | ⇑$_{HH}$R$^{ckbc}$ | |
| 18 | RET$_{HH}$//⇑CONT$_{LH}$W$^{ckbc}$ | |
| 19 | ⇑LH R$^{ckbc}$ R$^{ckbc}$ | |
| 20 | REF | Refresh Fault |
| 21 | ⇑R$^{ckb}$W$^1$ | |
| 22 | ⇑ROW R | |
| 23 | ⇑R$^1$ | |

Notes:
⇑/⇓ indicates sequentially addressing memory starting from lower/higher addresses.
Superscript p specifies inserting a 0,1 pattern (pc complement pattern) in memory.
RET$_{HH}$/RET$_{LH}$ denote a wait period to test retention ability of higher/lower half of memory.
// denotes two or more operations to be performed in "parallel", i.e., at the same time.
LH$_{add}$ O/HH$_{add}$O denote operation O performed on the lower/higher of memory.
⇑CONT$_{HH}$/⇑CONT$_{LH}$ denote performing operation O sequentially looping through sub block HH/LH during the waiting period for retention fault testing.
W$^{ckb}$/W$^{ckbc}$ denote writing a checkerboard 0,1 pattern/1,0 pattern in memory.
⇑ROW indicates that a single row of memory is to be read to check the hidden refresh.
REF activates the built-in circuit refresh.

In Table 2, Steps 1 through 5 are effective to detect faults F1 (SAF and TF); fault F2 (SOF) and fault F4 (MAF) faults:

Step 1 (⇑ W$^p$) writes a pattern p of 0s and 1s in a word of the DRAM. It may be all 1's or some other pattern depending on the specific arrangement of the cells.

Step 2 (⇑ R$^p$W$^{pc}$) performs two operations with respect to a word of the DRAM. First, it reads that word and expects to see the pattern p. Then it writes the complement pc of the pattern in the first word of the DRAM.

Step 3 (⇑ R$^{pc}$ W$^p$R$^p$W$^{pc}$) performs four operations with respect to a word of the DRAM. First, it performs a read operation and expects to see the complement pattern pc . Second, it writes back the pattern p . Third, it reads that word and expects to see the pattern p from this word. Fourth it writes the complement pattern pc into the word.

Step 4 (⇓ R$^{pc}$W$^p$) performs two operations. First, it reads a word of the DRAM and expects to see the complement pattern pc. Then it writes the pattern p into the word.

Step 5 (⇓ R$^p$W$^{pc}$R$^{pc}$W$^p$) performs 4 successive operations. First, it reads a word of the DRAM expecting to see the pattern p . Second, it writes the complement pattern pc into the word. Third, it reads the word and expects to see the complement pattern PC. Finally, it writes the pattern p into the word.

Step 6 through 10 detect the subthreshold retention fault F6 (STL). This type of retention fault may likely be occasioned by a missing polysilicon mask layer which allows charge to leak from capacitor transistor Q2 through transistor Q1 to the bit line.

Step 6 (⇑ W$^1$) addresses the memory locations in a prescribed order, i.e., from the lowest to the highest address and a pattern, such as all 1's, is written into each location, Step 7 (RET//LH$_{add}$R ) is a charge retention test of the upper half HH of memory. During the test, all of the bit lines in the upper half of memory are held low for a short time to allow the charge retention leakage time to expire while the word lines of the upper half are "frozen", i.e., are de-selected by holding these word lines low. While the test of the upper half of memory is going on, at least one world line in the lower half of memory is addressed (selected).

Step 8 (⇑ HH$_{add}$R$^1$) sequentially reads the memory locations in the upper portion of memory (which was not addressed in step 7) to see if the values that had been stored (in step 6) in the cells of the upper portion of memory have been erroneously affected by charge leakage.

Step 9 (RET//HH$_{add}$R) is a test of the lower half of memory during which all of the bit lines in the lower half of memory are held low for a short time to allow the charge retention leakage time to expire while the word lines in the lower half are "frozen", i.e., de-selected by holding these word lines low. While the test of the lower half of memory is going on, at least one world line in the upper half of memory is selected.

Step 10 (⇑ LH$_{add}$R$^1$) then sequentially reads the lower address locations in the DRAM to see if the any of the values that had been stored (in step 6) in the lower portion of memory have been erroneously affected by charge leakage.

Steps 11–18 test for storage capacitor leakage fault F5 (SCL) as well as for junction leakage fault F7 (JL). Junction leakage may be occasioned by a defective pn junction which allows charge leakage from the drain to substrate of a cell transistor thereby affecting a neighboring cell.

Step 11 (⇑ W$^{ckb}$) writes a two-dimensional physical "checkerboard" pattern of 1's and 0's throughout the DRAM memory so that every cell storing a "1" physically adjoins a neighbor cell storing the opposite value, i.e., "0".

Step 12 (RET$_{LH}$//⇑CONT$_{HH}$W$^{ckb}$) is a charge retention test of the lower half of memory during which the checkerboard pattern is sequentially and continuously written into locations in the upper half of memory to create a controlled disturbance while no action is taken in the lower half which is being tested Step 13 (⇑ LH$_{add}$R$^{ckb}$) then sequentially reads the lower half of memory to verify whether the checkerboard pattern (that had been stored in step 11) had changed during the charge retention test while the disturbance was occurring in the upper half during step 12.

Step 14 (RET$_{HH}$//⇑CONT$_{LH}$W$^{ckbc}$)) is a charge retention test of the upper half of memory during which the checkerboard pattern is sequentially and continuously written into locations in the lower half of memory to create a controlled disturbance while no action is taken in the upper half which is being tested Step 15 (⇑$_{HH}$R$^{ckb}$R$^{ckb}$) sequentially reads the upper half of the memory to verify whether the checkerboard pattern that had been written in step 11 has been affected by the writing of the complementary checkerboard pattern of disturbances.

Step 16 (RET$_{LH}$//⇑CONT$_{HH}$W$^{ckbc}$) repeats step 14 but with the actions taken with respect to the lower and upper halves of memory interchanged.

Step 17 (⇑$_{LH}$R$^{ckbc}$) sequentially reads the lower half of the memory to verify whether the checkerboard pattern that had been written in step 11 has been affected by the writing of the complementary checkerboard pattern of disturbances of step 16.

Step 18 ($RET_{HH}/\Uparrow CONT_{LH}W^{ckbc}$) is another charge retention test of the upper half of memory during which the checkerboard pattern is sequentially and continuously written into locations in the lower half of memory to create a controlled disturbance while no action is taken in the upper half which is being tested Step 19 ($\Uparrow_{LH}R^{ckbc}R^{ckbc}$) sequentially reads the lower half of the memory to verify whether the checkerboard pattern that had been written in step 11 has been affected by the writing of the complementary checkerboard pattern of disturbances of step 18. Note, the purpose of the second (destructive) read at the same address is to prepare for the ensuing refresh test steps.

Steps 20–23 test the efficacy of the refresh operation. As is well-understood, refresh is customarily performed throughout the memory, one row at a time while the column counter is frozen. Accordingly, the refresh operation depends on the number of rows in the DRAM.

Step 20 (REF ) prepares for the refresh test.

Step 21 ($\Uparrow R^{ckb}W^1$) reads the predetermined pattern, such as a checkerboard pattern previously written into the memory in step 19, and replaces it by writing in an all-ones pattern sequentially in each word of the memory.

Step 22 ($\Uparrow$ ROW R) sequentially addresses each row, reading one word therefrom.

Step 23 ($\Uparrow R^1$) sequentially reads every word address in every row to detect the presence of the all-ones pattern What has been described is deemed to be illustrative of the principles of the invention in one embodiment of which a test procedure for DRAMs runs in time proportional to the number of words in memory, plus time proportional to the time required to test for data, e.g., charge, retention. It should be appreciated that numerous modifications may be made. Thus, the verification steps described may be accomplished by reading out a stored word and comparing it bit by bit with the word expected or, alternatively an output data compaction technique may be employed using an array of logic gates to reduce the actual output to a simple "1" or "0" which may be compared to the compacted "1" or "0" value of the data that was stored. Numerous other modifications may be made by those skilled in the art without, however, departing from the spirit and scope of the invention.

What is claimed is:

1. A method of testing a dynamic random access memory unit having common bit access and word lines threaded therethrough, comprising the steps of
   a) storing a pattern of charges representing digital values throughout the memory unit;
   b) controlling a first region of said unit to be under test during an interval of time while simultaneously creating a disturbance in a second region of said unit, both said regions being threaded by said access lines, said controlling being effected by de-selection of said bit access lines and by simultaneously de-selecting the word lines thereof;
   c) waiting a portion of said time interval sufficient to allow charge leakage to occur; and
   d) addressing said first region of said unit to determine whether any of said stored digital values have changed by said disturbance through access lines.

2. The method of claim 1 wherein said pattern is a checkerboard pattern.

3. The method of claim 1 wherein, following said addressing of said first region of said unit, controlling said second region of said unit to be under test during an interval of time; creating a disturbance in said first region of said unit threaded by said access lines; waiting an interval of time sufficient to allow charge leakage to occur in said second region; and addressing said second region of said unit to determine whether any of said stored digital values have changed.

4. The method of claim 3 wherein said disturbance in said first region is created by continually writing a predetermined physical pattern of 1s and 0s sequentially through said first region during said time interval.

5. A method of self-testing a DRAM memory unit for stuck-at fault, stuck-open fault, transition fault, and multiple address fault, arising from static or dynamic coupling, and storage capacitor leakage, subthreshold leakage or junction leakage, as well as faults in the address decoder, comprising the steps of:
   a.) first addressing each location of the DRAM in a prescribed order,
   b.) writing a predetermined pattern in the first location;
   c.) reading the location,
   d.) repeating steps a) through c) using a complementary pattern;
   e.) repeating both steps a) through c) and d) while re-addressing the memory locations in the opposite order;
   f.) writing a predetermined pattern throughout the DRAM memory,
   g.) allowing a time sufficient for a defective storage element to lose its charge; and
   h.) sequentially addressing locations in a first portion of the memory to create a disturbance while reading locations in a second portion of the memory to verify whether changes in the stored pattern have occurred; said disturbance being created by continually writing a predetermined physical pattern of 1s and 0s sequentially through said second region during said time interval.

* * * * *